(12) United States Patent
Xiu et al.

(10) Patent No.: US 10,607,984 B2
(45) Date of Patent: Mar. 31, 2020

(54) HIGH VOLTAGE BIPOLAR STRUCTURE FOR IMPROVED PULSE WIDTH SCALABILITY

(71) Applicant: TEXAS INSTRUMENTS INCORPORATED, Dallas, TX (US)

(72) Inventors: Yang Xiu, Urbana, IL (US); Aravind C. Appaswamy, Plano, TX (US); Akram Salman, Plano, TX (US); Mariano Dissegna, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/445,188

(22) Filed: Jun. 18, 2019

(65) Prior Publication Data

US 2019/0304964 A1 Oct. 3, 2019

Related U.S. Application Data

(63) Continuation of application No. 15/173,360, filed on Jun. 3, 2016, now Pat. No. 10,381,342.

(60) Provisional application No. 62/235,748, filed on Oct. 1, 2015.

(51) Int. Cl.
| | |
|---|---|
| *H01L 27/02* | (2006.01) |
| *H01L 29/73* | (2006.01) |
| *H01L 29/417* | (2006.01) |
| *H01L 29/732* | (2006.01) |
| *H01L 29/06* | (2006.01) |

(52) U.S. Cl.
CPC ...... *H01L 27/0259* (2013.01); *H01L 29/0623* (2013.01); *H01L 29/0646* (2013.01); *H01L 29/41708* (2013.01); *H01L 29/7322* (2013.01)

(58) Field of Classification Search
CPC ............ H01L 27/0259; H01L 29/7322; H01L 29/0623; H01L 29/0646; H01L 29/41708; H01L 27/02; H01L 29/025; H01L 29/73
USPC ......................................................... 257/357
See application file for complete search history.

(56) References Cited

U.S. PATENT DOCUMENTS

| | | |
|---|---|---|
| 4,458,158 A | 7/1984 | Mayrand |
| 5,455,447 A | 10/1995 | Hutter et al. |
| | (Continued) | |

OTHER PUBLICATIONS

Notification of Transmittal of the International Search Report and the Written Opinion of the International Searching Authority, or the Declaration, dated Dec. 15, 2016.

*Primary Examiner* — Fazli Erdem

(74) *Attorney, Agent, or Firm* — Rose Alyssa Keagy; Charles A. Brill; Frank D. Cimino

(57) ABSTRACT

According to an embodiment, a bipolar transistor is disclosed for Electrostatic discharge (ESD) management in integrated circuits. The bipolar transistor enables vertical current flow in a bipolar transistor cell configured for ESD protection. The bipolar transistor includes a selectively embedded P-type floating buried layer (PBL). The floating P-region is added in a standard NPN cell. During an ESD event, the base of the bipolar transistor extends to the floating P-region with a very small amount of current. The PBL layer can provide more holes to support the current resulting in decreased holding voltage of the bipolar transistor. With the selective addition of floating P-region, the current scalability of the bipolar transistor at longer pulse widths can be significantly improved.

16 Claims, 5 Drawing Sheets

(56) References Cited

U.S. PATENT DOCUMENTS

| | | | |
|---|---|---|---|
| 5,648,281 A * | 7/1997 | Williams | H01L 21/8249 |
| | | | 438/358 |
| 6,060,752 A | 5/2000 | Williams | |
| 6,395,593 B1 * | 5/2002 | Pendharkar | H01L 21/761 |
| | | | 257/E21.544 |
| 6,570,229 B1 * | 5/2003 | Harada | H01L 27/0623 |
| | | | 257/373 |
| 6,716,709 B1 | 4/2004 | Springer et al. | |
| 6,933,559 B1 | 8/2005 | Van Roijen et al. | |
| 7,488,662 B2 | 2/2009 | Zhang et al. | |
| 9,105,712 B1 | 8/2015 | Levy et al. | |
| 2002/0084489 A1 | 7/2002 | Yamamoto | |
| 2004/0032005 A1 | 2/2004 | Williams | |
| 2006/0001102 A1 * | 1/2006 | Pendharkar | H01L 29/1083 |
| | | | 257/368 |
| 2006/0261408 A1 * | 11/2006 | Khemka | H01L 29/063 |
| | | | 257/335 |
| 2006/0267102 A1 | 11/2006 | Cheng et al. | |
| 2011/0062547 A1 | 3/2011 | Onishi et al. | |
| 2011/0215373 A1 | 9/2011 | Kwon | |
| 2013/0072004 A1 | 3/2013 | Tsuchiko | |
| 2013/0285113 A1 | 10/2013 | Edwards et al. | |
| 2014/0070315 A1 | 3/2014 | Levy et al. | |
| 2014/0124828 A1 * | 5/2014 | Salman | H01L 29/7436 |
| | | | 257/133 |
| 2015/0243770 A1 | 8/2015 | Hebert et al. | |
| 2015/0270257 A1 | 9/2015 | Edwards et al. | |
| 2015/0279969 A1 | 10/2015 | Levy et al. | |
| 2015/0340496 A1 | 11/2015 | Zhang | |

* cited by examiner

HIGH VOLTAGE BIPOLAR STRUCTURE FOR IMPROVED PULSE WIDTH SCALABILITY

CROSS-REFERENCE TO RELATED APPLICATIONS

This Continuation application claims priority to U.S. patent application Ser. No. 15/173,360 filed Jun. 3, 2016, which claims the benefit of and priority to the U.S. provisional patent Application No. 62/235,748, filed Oct. 1, 2015, the entirety of both is hereby incorporated herein by reference for all purposes.

TECHNICAL FIELD

This disclosure relates generally to the field of semiconductor devices and more particularly to managing Electrostatic Discharge (ESD) in semiconductor devices.

BACKGROUND

Generally, vertical NPN semiconductor structures are used for ESD protection in high-voltage applications because vertical NPN structures provide efficient current handling capability. To manage ESD in larger semiconductor device, the breakdown current needs to be scalable proportional to the size of the device and semiconductor structure including for long pulse widths. Typically, larger semiconductor structures form localized current filaments, which can prevent them from achieving current scalability for longer pulse width.

SUMMARY

In accordance with an embodiment, a semiconductor device is disclosed. The semiconductor device include a substrate, an N-type buried layer formed in the substrate, an Nwell layer formed over the N-type buried layer, a Pwell layer formed within the Nwell layer, and a P-type buried layer formed within the Nwell layer over the N-type buried layer and under the Pwell layer.

In accordance with another embodiment an integrated circuit is disclosed. The integrated circuit includes a substrate, wherein an N-type buried layer is positioned in the substrate, an Nwell layer is positioned over the N-type buried layer, a Pwell layer is formed within the Nwell layer, and a P-type buried layer is formed within the Nwell layer over the N-type buried layer and under the Pwell layer, and a bipolar transistor includes a base positioned in a P+ region diffused in the Pwell layer, an emitter positioned in the N+ region diffused in the Pwell layer, and a collector positioned in the N-type buried layer.

In accordance with yet another embodiment, an electrostatic discharge device is disclosed. The electrostatic discharge device includes a bipolar transistor formed in a substrate, wherein an N-type buried layer is positioned in the substrate, an Nwell layer is positioned over the N-type buried layer, a Pwell layer is formed within the Nwell layer, and a P-type buried layer formed within the Nwell layer over the N-type buried layer and under the Pwell layer, wherein the bipolar transistor includes a base positioned in a P+ region diffused in the Pwell layer, an emitter positioned in an N+ region diffused in the Pwell layer, and a collector positioned in the N-type buried layer.

DETAILED DESCRIPTION

The following description provides many different embodiments, or examples, for implementing different features of the subject matter. These descriptions are merely for illustrative purposes and do not limit the scope of the invention.

According to an embodiment, a bipolar transistor is disclosed for ESD management with scalability for longer pulse widths. The bipolar transistor enables uniform current flow in an NPN cell for ESD protection. The bipolar transistor includes a selectively embedded P-type buried layer. A floating P-region is added between an Nwell and N-buried layer (NBL) of a standard NPN cell. Nwell is lightly doped and it gets depleted at low voltage leading to a punch through from the floating p-buried region to the base of NPN cell. This causes a reduction in Kirk effect, which reduces the non-uniformity of current flow leading to less filamentation. With the selective floating P-buried region, the pulse width scalability of NPN cells at longer pulse width lengths (e.g., 200 ns, 500 ns, and longer) can be significantly improved for ESD events.

Figure 1A:
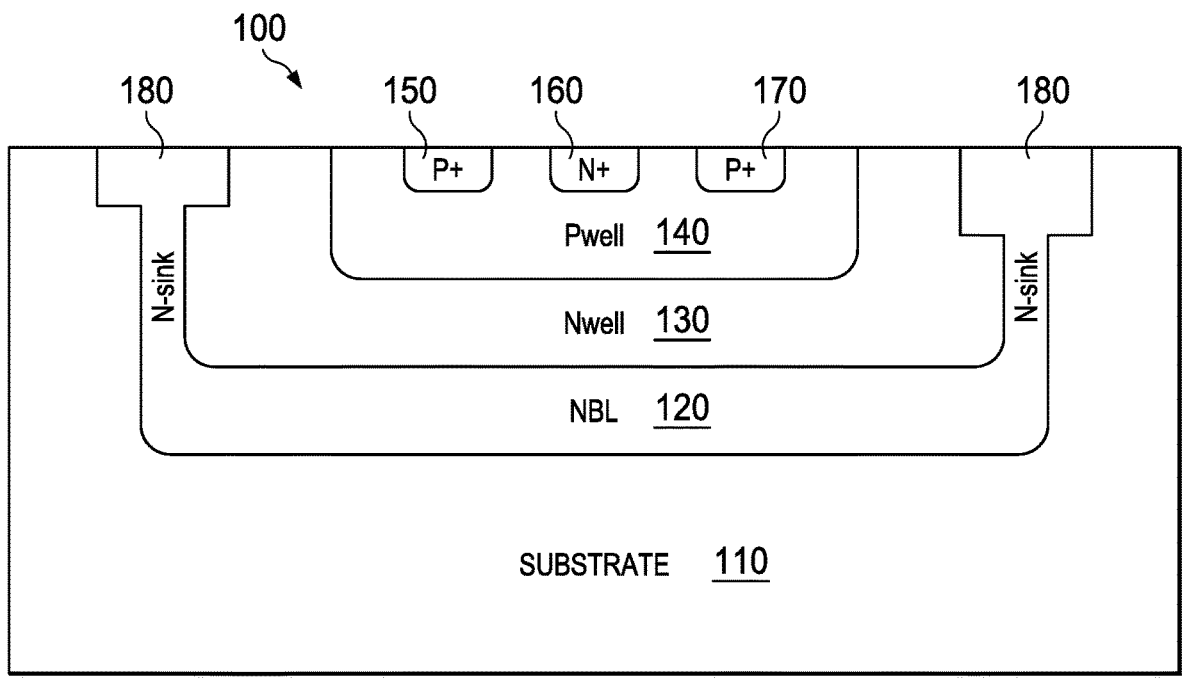
FIG. 1A illustrates a cross-sectional view of a standard NPN semiconductor cell.

Referring to FIG. 1A, a cross-sectional view of standard NPN semiconductor cell 100 is illustrated. NPN Cell 100 includes a substrate 110, an N-buried layer 120, an Nwell 130, and a Pwell 140. The cell 100 further includes P+ bases 150 and 170, and N+ emitter 160. The connection for NBL 120 form collector 180 for NPN cell 100 in substrate 110. Typically, a resistor (e.g., 20 kΩ resistor) is connected between the bases 150 and 170 of the single-finger NPN and the emitter 160. The lateral spacing between the N-sink and Pwell 140 affects the breakdown voltage and trigger voltage of the structure. The impact ionization of lateral junctions between layers provide part of the hole current to the P+ bases 150/170.

There can be several parallel current paths from the P+ bases 150/170 to the emitter region 160. These current paths can be vertical or non-vertical, for example diagonal or lateral between various layers. When NPN cell 100 turns on, most of the current travels along the vertical path from NBL 120 (collector) to the emitter 160. Relatively small current flows through the non-vertical NPNs due to the longer base width and the location of the base contacts. A filament may form as the well-known Kirk Effect pushes the location of the peak field towards NBL 120. After NPN cell 100 is triggered in snapback mode, most of the current travels through a path from NBL 120 to the emitter 160 with its larger area. The current through lateral NPN cell is less favored because of the longer base width and the location of the base contact. Ideally, the maximum amount of current the vertical path can handle can be predicted using the known Wunsch-Bell curve.

Figure 1B:
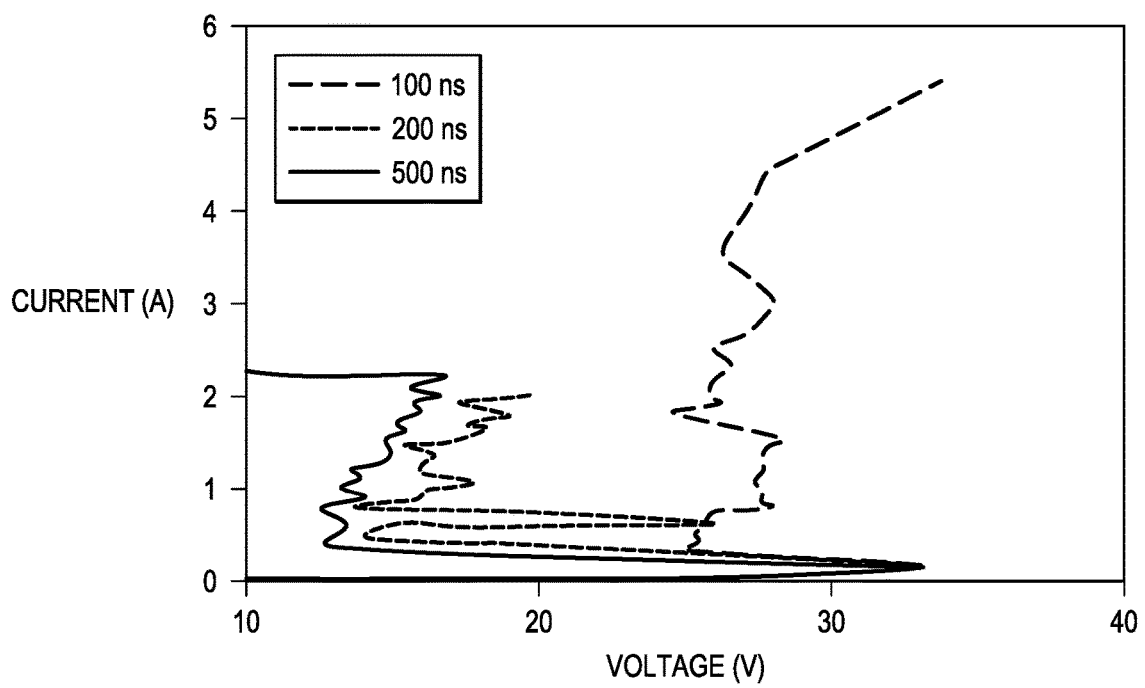
FIG. 1B illustrates a Transmission Line Pulse-width measurement of a standard NPN semiconductor cell.

Referring to FIG. 1B, a Transmission Line Pulse-width (TLP) measurement of standard NPN cell 100 is illustrated. The voltage and current measurements are made at the end of the pulse. With a 10 ns rise time and for pulses longer than 200 ns, the structure tends to fail earner than expected. For the 100 ns TLP curves, there is a change of on-resistance slightly below 1A, which indicates the existence of at least two current paths. As illustrated, another noticeable change is that the holding voltage of the structure shifts to a smaller value for longer pulses, which indicates forming of filament.

For pulse widths 200 ns and longer, a second snapback occurs at a current level only slightly above that for the first snapback. This further illustrates that current filament has formed in the device. For pulse-widths larger than 100 ns, NPN cell 100 enters a second breakdown at a current level lower than would be predicted by the known Wunsch-Bell relation, which may be due to effective ballasting for shorter pulse widths. Thus, the conventional structure is not scalable for longer pulse widths (e.g., 100 ns and longer) for ESD events.

Figure 2A:
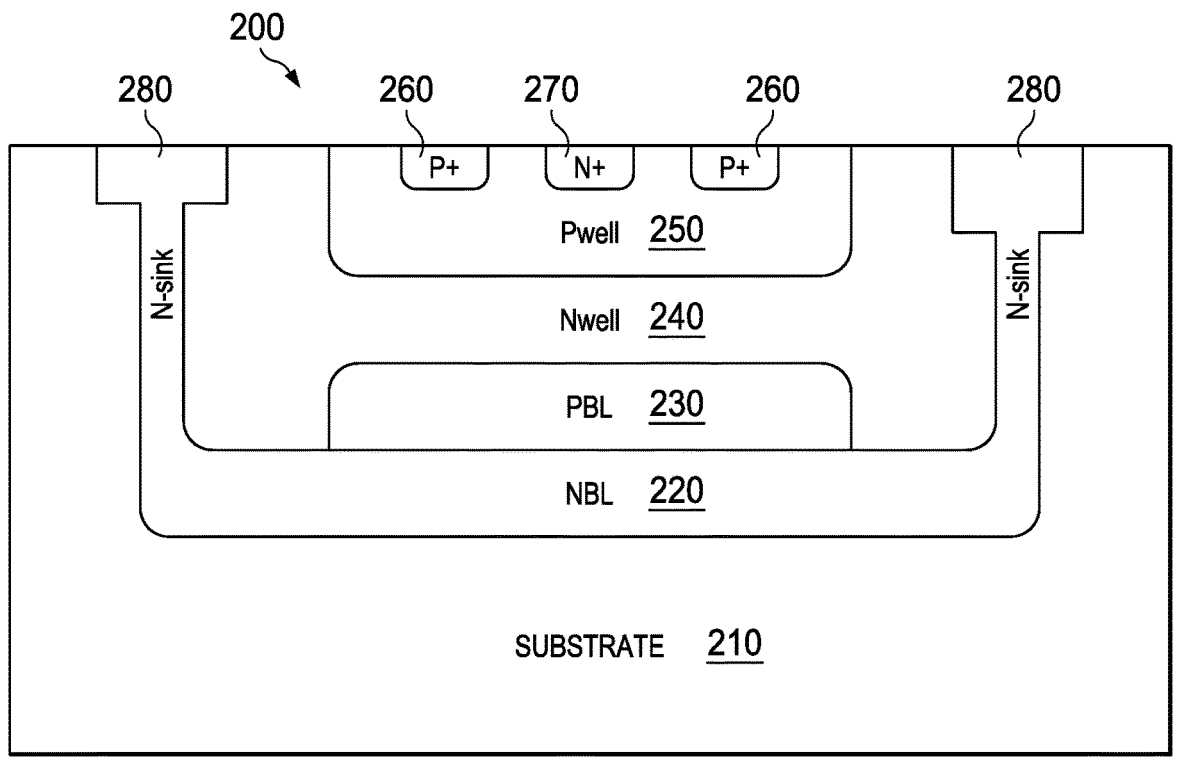
FIG. 2A illustrates an exemplary cross-sectional view of an NPN bipolar transistor cell structure according to an embodiment.

Referring to FIG. 2A, an exemplary cross-sectional view of a NPN bipolar transistor cell structure 200 is illustrated according to an embodiment. NPN cell 200 Ls developed on a substrate 210. An N-buried layer (NBL) 220 is diffused in substrate 210. NBL 220 can be diffused in substrate 210 using various known processing techniques. NBL 220 provides a low resistance collector for the bipolar transistor. A Pwell 250 provides a location for forming P+ bases 260 and an N+ emitter 270. A floating P-buried layer (PBL) 230 is selectively added in Nwell 240 between NBL 220 and Pwell 250. The connection for NBL 220 form collector connection 280 for NPN bipolar transistor in substrate 210. The selective addition of floating PBL 230 reduces the parasitic capacitance associated with NPN cell 200 when compared to a deeper Pwell configuration.

The floating PBL 230 allows independent tuning of the breakdown voltage by controlling the space either (i) between Pwell 250 and N-sink, or (ii) between floating PBL 230 and N-sink. During an ESD event, high voltage seen on the collector causes the depletion region between Pwelll 250-Nwell 240 and PBL 230-well 240 to expand, which causes Pwell 230 and PBL 230 to punch through to each other. This causes the collector-base depletion region boundary to move from the Pwell 250-Nwell 240 junction to the PBL 230-NBL 220 junction. In a transistor that lacks a P-buried layer, such as PBL 250, at high current, all of the Nwell region between Pwell and NBL get depleted due to base pushout effect, which causes the trigger voltage to increase, resulting in a strong snapback behavior for example from 32V to 23V as illustrated in FIG. 1B. The strong snapback along with the intrinsic non-uniformity of high current base pushout effects cause the current flow to be non-uniform, thereby leading to filamentary conduction. According to an embodiment, with the addition of a P-buried layer (e.g., PBL 250), the amount of base pushout is significantly reduced, which causes more uniform current flow resulting in effective ESD management.

While for exemplary purposes, specific shapes and widths of various layers are shown; however, the shapes and widths of various layers can be adjusted to determine specific breakdown voltage for the NPN transistor cell. For example, according to an embodiment, the width of the PBL 230 may be substantially same as the width of emitter 270 (e.g., within 10% range of the width of emitter 270). The tolerance in widths of PBL 230 and emitter 270 can be based on the alignment between PBL mask and near surface doping. According to another embodiment, the width of Pwell 250 can be extended laterally to adjust the space between Pwell and N-Sink thus providing a specific breakdown voltage. According to yet another embodiment, the width of Pwell 250 may be smaller than PBL 230. Further the shapes and widths of various layers can be modified individually or in combination thereof to provide desired breakdown voltage for a given application.

According to another embodiment, the doping level in Nwell 240 for example, the region that is bellow Pwell 250 or the doping level of PBL layer 230 for example, the top region that is closer to Nwell 240 can be tuned such that Pwell 250 can 'punch' through the PBL layer 230 at a voltage that is lower than the holding voltage of the bipolar device resulting in effective ESD control. The doping level can be selected based on a given geometry of the semiconductor device. The doping level in the selected regions defined hereinabove can be adjusted to allow ESD current to 'punch' through Pwell 250 with least resistance toward PBL layer 230 thus allowing the vertical current flow without affecting the rest of NPN transistor cell 200. According to another embodiment, PBL layer 230 can be selectively implanted anywhere in the given substrate 210 to direct current flow in a selected direction at voltage lower than the holding voltage thus improving the ESD resilience characteristics of NPN transistor cell 200.

While for exemplary purposes specific dopant types are shown; however, one skilled in the art will appreciate that the conductivity and dopant types of each layer can be reversed (e.g., N-buried layer in a P substrate, PNP transistor, etc.) to provide opposite polarities for the cell for example, all N-type dopants can be replaced with P-type dopants and all P-type dopants can be replaced with N-type dopants to accomplish similar ESD event management by directing the current in the vertical direction within the device, thus providing improved pulse width scalability.

Figure 2B:
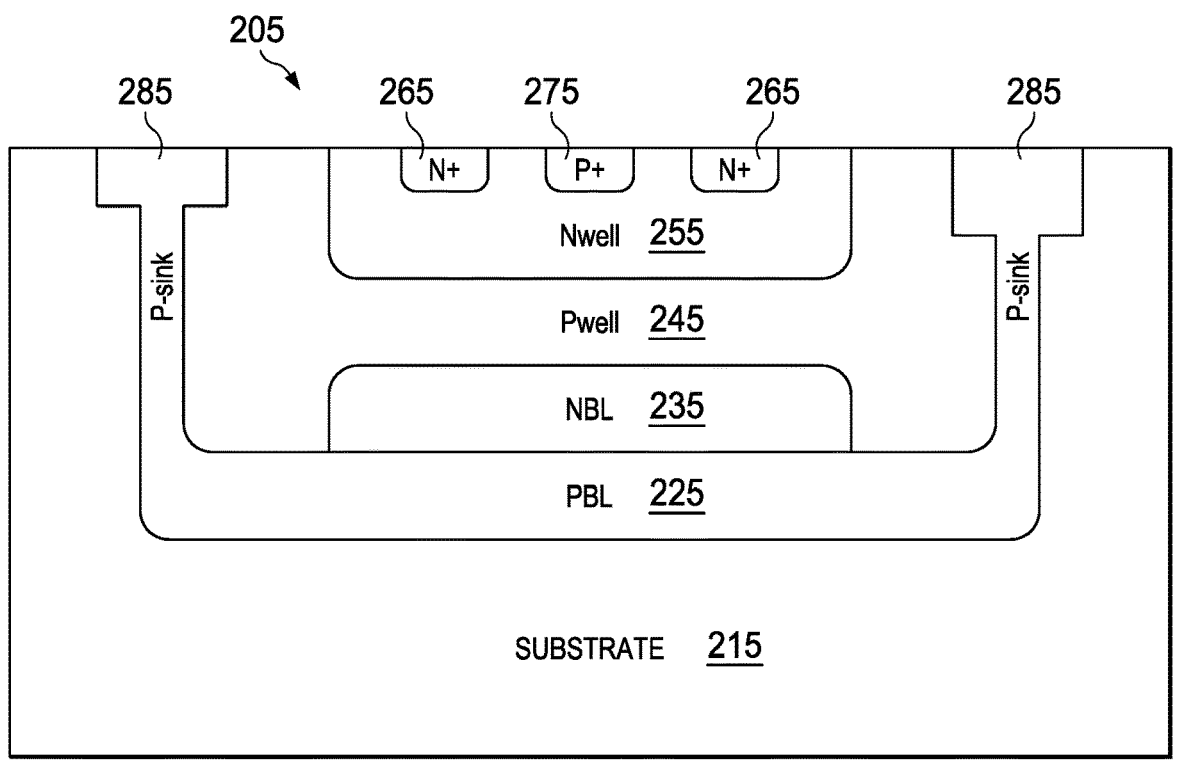
FIG. 2B illustrates an exemplary cross-sectional view of a PNP bipolar transistor cell structure according to an embodiment.

Referring to FIG. 2B, an exemplary cross-sectional view of a PNP bipolar transistor cell structure 205 is illustrated according to an embodiment. The structure and function of the PNP bipolar transistor cell 205 is similar to NPN bipolar transistor cell 200 except that in the PNP bipolar transistor cell 205, the dopants are reverse to provide a PNP transistor cell structure. PNP cell 205 includes a substrate 215, a P-buried layer (PBL) 225, an Nwell 255, which provides N+ bases 265 and P+ emitter 275. A floating N-buried layer (NBL) 235 is selectively added in Pwell 245 above PBL 225 and below Nwell 255. The connection for PBL 225 form collector 285 for PNP bipolar transistor cell 205 in substrate 215. As stated herein above, functional aspects of PNP transistor 205 are similar to NPN transistor cell 200 with reverse dopant and reverse polarities.

While for exemplary purposes, PBL 230 (NBL 220) is shown over the entire NBL 220; however, PBL 230 (NBL 220) can also be selectively pieced on a portion of NBL 220 for example, PBL 230 (NBL 220) may be partially placed only under N-sinks 280 (P-sink) over NBL 220 (PBL 225) with a break in the N-sinks (P-sink). Further, the size of PBL 230 (NBL 220) can also be adjusted according to a particular implementation of NPN (PNP) cell. The P-buried (N buried) bipolar NPN (PNP) transistor cell structure such as the one illustrated in FIGS. 2A&B, can be implemented to manage ESD breakdown current in semiconductor devices. For example, the P-buried bipolar NPN transistor such as the one illustrated in FIG. 2A can be connected in parallel with a device circuit to provide ESD protection for the device circuit.

Figure 2C:
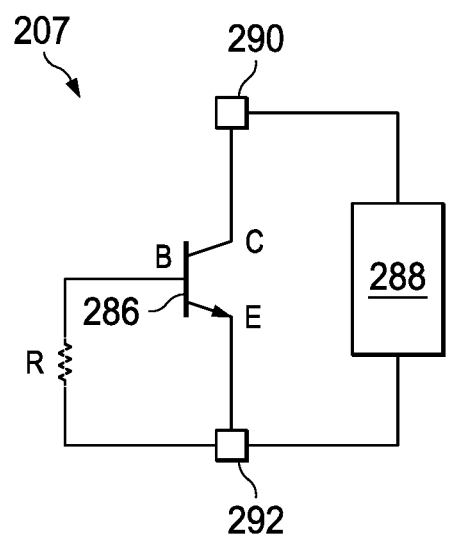
FIG. 2C illustrates an exemplary implementation circuit for a P-buried bipolar NPN transistor for ESO management in an integrated circuit according to an embodiment.

Referring to FIG. 2C, an exemplary implementation circuit 207 for a P-buried bipolar NPN transistor used for ESD management in an integrated circuit is illustrated according to an embodiment. Circuit 207 includes a P-buried NPN bipolar transistor 286, such as for example NPN cell 200 illustrated in FIG. 2A. NPN bipolar transistor 286 may be connected in parallel with a device circuit 288, which may require ESD protection. The device circuit 288 can be any circuit integrated in the same substrate as the one including NPN bipolar transistor 286 or NPN bipolar transistor 286 can be used as an external component for the device circuit 288. NPN bipolar transistor 286 includes a collector C, a base B, and an emitter E. The collector C of NPN bipolar transistor 286 is connected with the device circuit 288 at a pad 290. The pad 290 is an ESD pad for circuit 207 and it can be placed such to receive and absorb ESD current injection for circuit 207. The base B of NPN bipolar transistor 286 is connected with the emitter E, at pad 292. The base B can be connected with the emitter E either directly or optionally via a suitable resistor R. During an ESD event, NPN bipolar transistor 286 absorbs electrostatic charge current by breaking down quickly to provide least resistive vertical current path for ESD current, thus preventing the device circuit 288 from potential damage that may be caused by the ESD charge current.

Figure 2D:
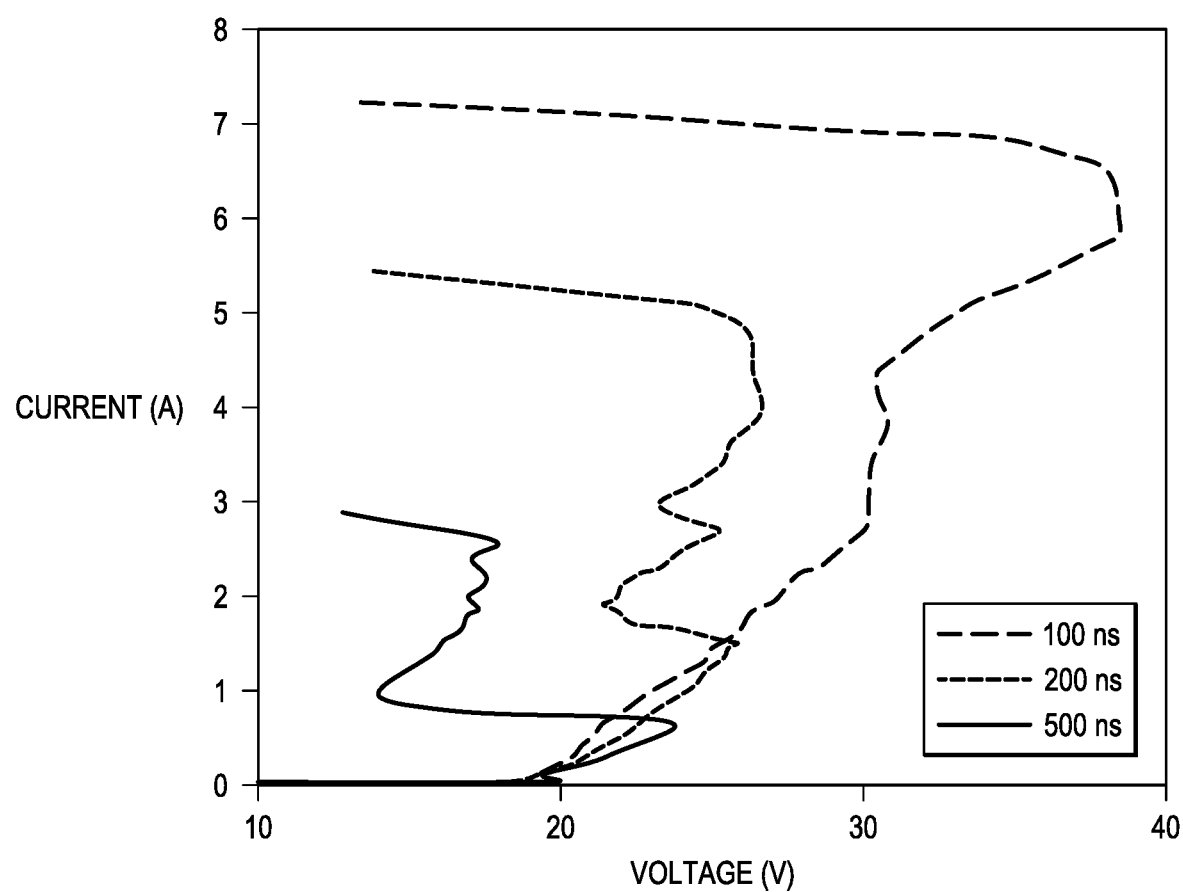
FIG. 2D illustrates an exemplar/transmission line pulse-width measurements for an exemplary NPN bipolar transistor cell structure with P-buried layer according to an embodiment.

Referring to FIG. 2D, an exemplary transmission line pulse-width (TLP) measurements for exemplary NPN bipolar transistor cell structure with P-buried layer, such as NPN cell structure 200, is illustrated according to an embodiment. As illustrated, as the pulse-width increases, the base of the device is pushed only up to P-buried layer, such as PBL 230 as illustrated in FIG. 2A, which results in effective vertical current flow.

Figure 3A:
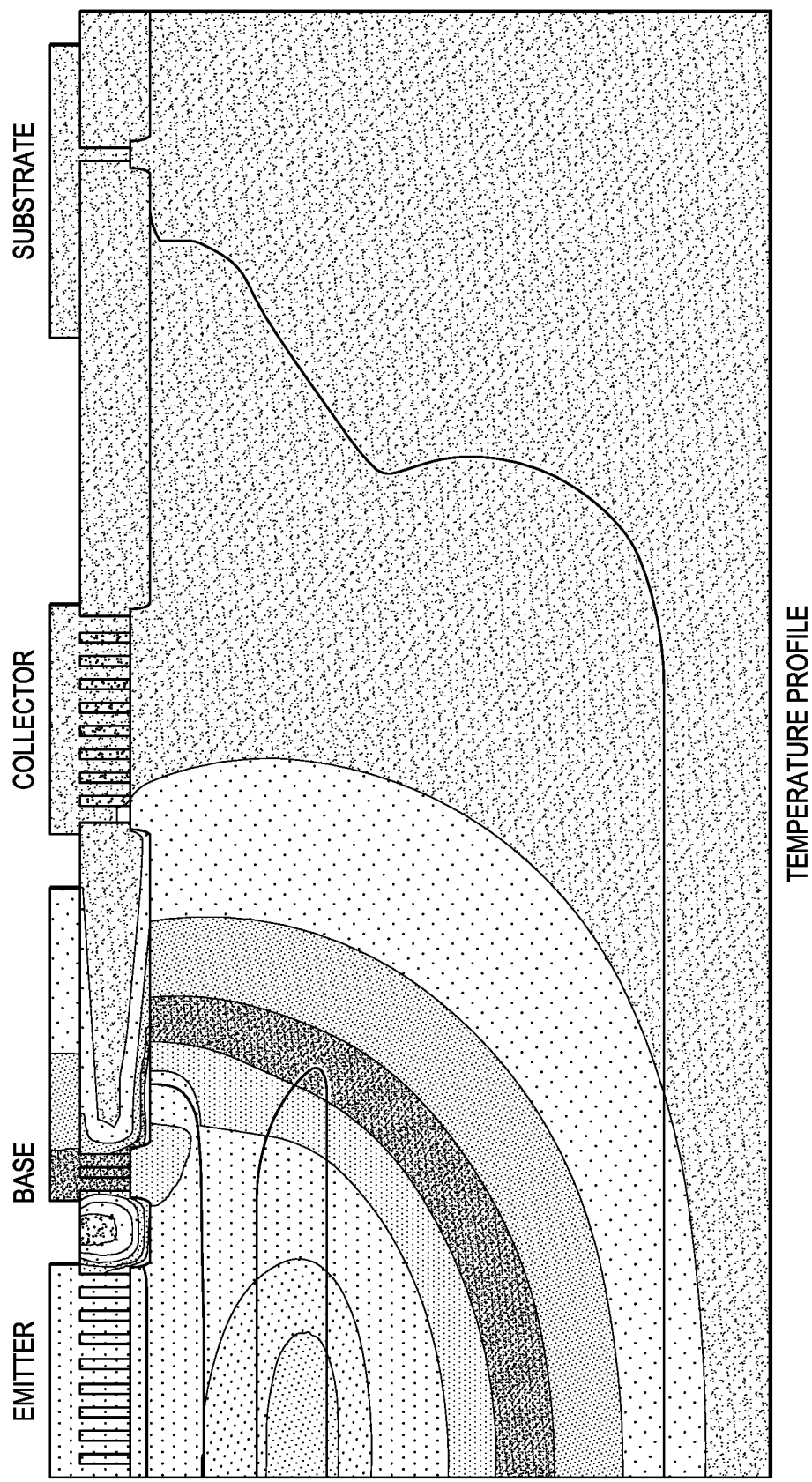
FIG. 3A illustrates an exemplary technology computer aided design (TCAD) simulated temperature profile of an exemplary NPN bipolar transistor cell structure according to an embodiment.

Referring to FIG. 3A, an exemplary TCAD simulated temperature profile of exemplary NPN bipolar CMOS transistor cell 200 is illustrated according to an embodiment. As illustrated, a significant amount of current in NPN bipolar transistor cell 200 flows through the vertical NPN structure resulting in a balanced temperature profile. This shows that the current flows in vertical direction as required.

Figure 3B:
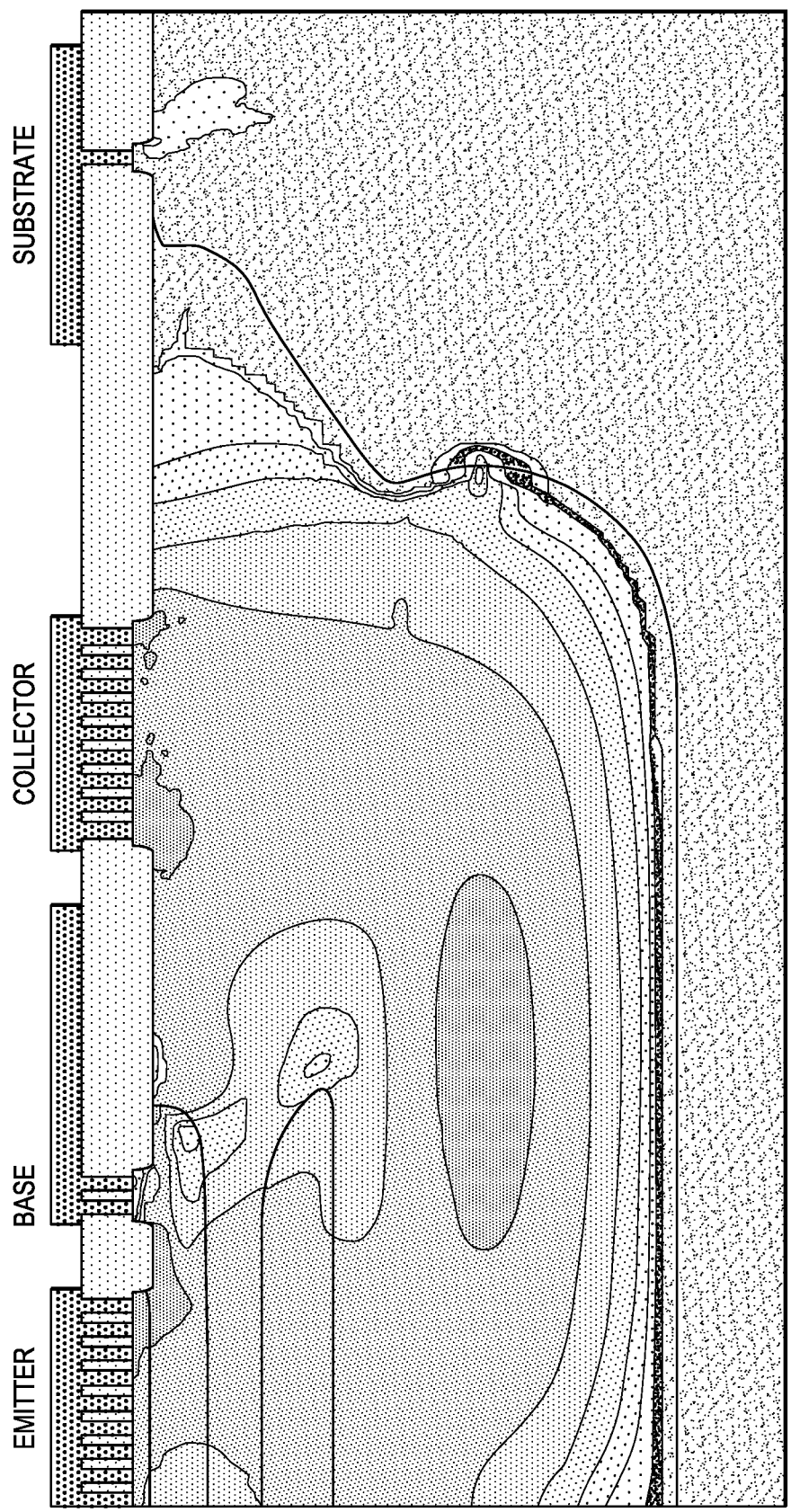
FIG. 3B illustrates a TCAD electron density profile of an exemplary NPN bipolar transistor cell structure according to an embodiment.

Referring to FIG. 3B, an exemplary TCAD electron density profile of transistor 200 is illustrated according to an embodiment. As illustrated, the majority of electrons flow beneath the emitter, which suggests that the area of NPN bipolar transistor is optimally utilized for conducting current and dissipating heat.

As stated hereinabove, in conventional ESD implementation the electrostatic charge current can flow non-uniformly resulting in reduced ESD robustness especially for longer pulse widths. According to various embodiments explained hereinabove, the electrostatic charge current can be made more uniform with selective implantation of P-buried (or N-buried) layer thereby increasing the robustness of the device.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims. Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

Moreover, "exemplary" is used herein to mean serving as an example, instance, illustration, etc., and not necessarily as advantageous. Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor device comprising:
   a substrate;
   an N-type buried layer formed in the substrate forming a collector of a bipolar transistor;
   an Nwell layer formed over the N-type buried layer;
   a Pwell layer formed within the Nwell layer; and
   a P-type buried layer formed within the Nwell layer, the P-type buried layer being located over and interfacing with the N-type buried layer, and the majority of the P-type buried layer being located directly under and spaced apart from the Pwell layer.

2. The semiconductor device of claim 1, further comprising:
   a P+ region diffused in the Pwell layer and forming a base of the bipolar transistor; and
   an N+ region diffused in the Pwell layer and forming an emitter of the bipolar transistor.

3. The semiconductor device of claim 1, wherein a width of the P-type buried layer is substantially same as a width of the Pwell layer.

4. The semiconductor device of claim 2, wherein a width of the P-type buried layer is substantially same as a width of the emitter of the bipolar transistor.

5. The semiconductor device of claim 3, wherein the width of the P-type buried layer corresponds to a breakdown voltage of the bipolar transistor.

6. The semiconductor device of claim 1, wherein a width of the P-type buried layer is larger than a width of the Pwell layer.

7. An integrated circuit comprising:
a substrate;
an N-type buried layer positioned in the substrate;
an Nwell layer positioned over the N-type buried layer;
a Pwell layer positioned within the Nwell layer;
a P-type buried layer positioned within the Nwell layer, the P-type buried layer being located over and interfacing with the N-type buried layer, and the majority of the P-type buried layer being located directly under and spaced apart from the Pwell layer; and
a bipolar transistor, including:
 a base in a P+ region diffused in the Pwell layer,
 an emitter in n N+ region diffused in the Pwell layer, and
 a collector extending to the N-type buried layer.

8. The integrated circuit of claim 7, wherein a width of the P-type buried layer is substantially same as a width of the Pwell layer.

9. The integrated circuit of claim 7, wherein a width of the P-type buried layer is substantially same as a width of the N+ region.

10. The integrated circuit of claim 7, wherein a width of the P-type buried layer corresponds to a breakdown voltage of the bipolar transistor.

11. The integrated circuit of claim 7, wherein a width of the P-type buried layer is larger than a width of the Pwell layer.

12. An electrostatic discharge device comprising:
a substrate;
an N-type buried layer positioned in the substrate;
an Nwell layer positioned over the N-type buried layer;
a Pwell layer positioned within the Nwell layer;
a P-type buried layer positioned within the Nwell layer, the P-type buried layer being located over and interfacing with the N-type buried layer, and the majority of the P-type buried layer being located directly under and spaced apart from the Pwell layer: and
a bipolar complementary metal-oxide semiconductor (BiCMOS) circuit having a bipolar transistor, the bipolar transistor having:
 a base in a P+ region diffused in the Pwell layer,
 an emitter in the N+ region diffused in the Pwell layer, and
 a collector extending to the N-type buried layer.

13. The electrostatic discharge device of claim 12, wherein a width of the P-type buried layer is substantially same as a width of the Pwell layer.

14. The electrostatic discharge device of claim 12, wherein a width of the P-type buried layer is substantially same as a width of the N+ region of the bipolar transistor.

15. The electrostatic discharge device of claim 12, wherein a width of the P-type buried layer corresponds to a breakdown voltage of the bipolar transistor.

16. The electrostatic discharge device of claim 12, wherein a width of the P-type buried layer is larger than a width of the Pwell layer.

* * * * *